United States Patent
Chen et al.

(10) Patent No.: US 11,209,214 B2
(45) Date of Patent: Dec. 28, 2021

(54) HEAT DISSIPATION DEVICE

(71) Applicant: AURAS Technology Co., Ltd., New Taipei (TW)

(72) Inventors: Chien-An Chen, New Taipei (TW); Chien-Yu Chen, New Taipei (TW); Tai-Wen Chen, New Taipei (TW); Kuan-Cheng Lu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 372 days.

(21) Appl. No.: 16/379,859

(22) Filed: Apr. 10, 2019

(65) Prior Publication Data
US 2020/0284522 A1 Sep. 10, 2020

(30) Foreign Application Priority Data
Mar. 8, 2019 (TW) ................................ 108107890

(51) Int. Cl.
| F28D 15/02 | (2006.01) |
| H01L 23/367 | (2006.01) |
| H05K 7/20 | (2006.01) |
| H01L 23/427 | (2006.01) |

(52) U.S. Cl.
CPC ..... *F28D 15/0233* (2013.01); *F28D 15/0275* (2013.01); *H01L 23/367* (2013.01); *H01L 23/427* (2013.01); *H05K 7/2039* (2013.01); *H05K 7/20254* (2013.01); *H05K 7/20336* (2013.01)

(58) Field of Classification Search
CPC ............. F28D 15/0241; F28D 15/0233; F28D 15/0275; F28F 2275/00; F28F 9/06; F28F 9/26
See application file for complete search history.

(56) References Cited

U.S. PATENT DOCUMENTS

| 3,604,503 | A | * | 9/1971 | Feldman, Jr | F28D 15/0241 165/96 |
| 6,111,749 | A | * | 8/2000 | Lamb | H01L 23/473 361/699 |
| 6,152,213 | A | * | 11/2000 | Suzuki | F28D 15/0241 165/104.26 |
| 9,901,013 | B2 | * | 2/2018 | Shedd | F25B 23/006 |
| 10,299,413 | B2 | * | 5/2019 | Cui | H05K 7/1487 |
| 10,739,084 | B2 | * | 8/2020 | Tsai | H05K 7/20272 |
| 2006/0254753 | A1 | * | 11/2006 | Phillips | F28D 15/043 165/100 |
| 2008/0093054 | A1 | * | 4/2008 | Tilton | H05K 7/20681 165/104.21 |
| 2008/0196234 | A1 | * | 8/2008 | Paschetto | F28F 9/06 29/463 |
| 2009/0120625 | A1 | * | 5/2009 | Janezich | F28F 9/12 165/173 |
| 2011/0313576 | A1 | * | 12/2011 | Nicewonger | F28D 15/00 700/282 |
| 2019/0072334 | A1 | * | 3/2019 | Xiao | H01L 23/473 |

* cited by examiner

*Primary Examiner* — Jon T. Schermerhorn, Jr.
(74) *Attorney, Agent, or Firm* — WPAT, PC

(57) ABSTRACT

A heat dissipation device includes two connected components and a flexible metal conduit. Each connected component is selected from a manifold, a quick connector, an evaporator, a condenser or a pump. The two connected components are in communication with each other through the flexible metal conduit. The use of the flexible metal conduit is effective to absorb the designing tolerance. In addition, the flexible metal conduit is recyclable.

7 Claims, 4 Drawing Sheets

HEAT DISSIPATION DEVICE

FIELD OF THE INVENTION

The present invention relates to a heat dissipation device, and more particularly to a heat dissipation device including conduits.

BACKGROUND OF THE INVENTION

In a conventional heat dissipation device, two components to be connected are in communication with each other through a rigid conduit. Since the rigid conduit is not adjustable, the rigid conduit is unable to absorb the designing tolerance. As known, the use of a soft conduit such as a plastic pipe (e.g., a PVC pipe) can overcome the above drawbacks. However, the plastic pipe is not environmentally friendly. Therefore, the existing heat dissipation device needs to be further improved.

SUMMARY OF THE INVENTION

For overcoming the drawbacks of the conventional technologies, the present invention provides a heat dissipation device with a flexible metal conduit. The use of the flexible metal conduit is effective to absorb the designing tolerance. In addition, the flexible metal conduit is recyclable.

In accordance with an aspect of the present invention, a heat dissipation device is provided. The heat dissipation device includes two connected components and a flexible metal conduit. Each connected component is selected from a manifold, a quick connector, an evaporator, a condenser or a pump. The two connected components are in communication with each other through the flexible metal conduit.

In an embodiment, the two connected components are the manifold and the quick connector, respectively.

In an embodiment, the two connected components are the manifold and the evaporator, respectively.

In an embodiment, the two connected components are the quick connector and the evaporator, respectively.

In an embodiment, the two connected components are two evaporators.

In an embodiment, the two connected components are the manifold and the condenser, respectively.

In an embodiment, the two connected components are the manifold and the pump, respectively.

In an embodiment, the two connected components are the evaporator and the condenser, respectively.

In an embodiment, the flexible metal conduit is connected with at least one of the two connected components through a welding means.

In an embodiment, one of the two connected components is the quick connector, and the flexible metal conduit is connected with the quick connector through a screwing means or a destructive pressing means.

In an embodiment, one of the two connected components is the quick connector, and the flexible metal conduit is connected with the quick connector through an anti-releasing mechanism.

In an embodiment, the anti-releasing mechanism comprises a retaining ring and a leakproof seal ring, and the flexible metal conduit comprises a first groove and a second groove beside the first groove. The retaining ring is accommodated within the first groove. The leakproof seal ring is accommodated within the second groove.

In accordance with another aspect of the present invention, a heat dissipation device is provided. The heat dissipation device includes two connected components and a flexible metal conduit. Each connected component is selected from a manifold, an evaporator, a condenser or a pump. At least one of two ends of the flexible metal conduit has a quick connector. The two connected components are in communication with each other through the flexible metal conduit.

In an embodiment, the flexible metal conduit is connected with the quick connector through an anti-releasing mechanism.

In an embodiment, the flexible metal conduit is connected with at least one of the two connected components through a welding means, a screwing means or a destructive pressing means.

From the above descriptions, the heat dissipation device of the present invention is equipped with the flexible metal conduit. Since the flexible metal conduit has the flexible property, the flexible metal conduit is effective to absorb the designing tolerance. Moreover, since the flexible metal conduit is made of the metallic material, the flexible metal conduit is recyclable. Consequently, the drawbacks of the conventional technologies can be overcome. As known, the pipe body made of plastic material has the leaking problem. Since the substance within the pipe body possibly leaks out from the pipe wall of the plastic pipe body, the reliability of the conventional heat dissipation device is deteriorated. Moreover, since the heat dissipation device of the present invention is equipped with the flexible metal conduit, the substance within the flexible metal conduit will not leak out from the metallic wall of the flexible metal conduit. When compared with the heat dissipation device using the plastic pipe, the present heat dissipation device using the flexible metal conduit can effectively avoid the leaking problem. Consequently, the reliability of the heat dissipation device is enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
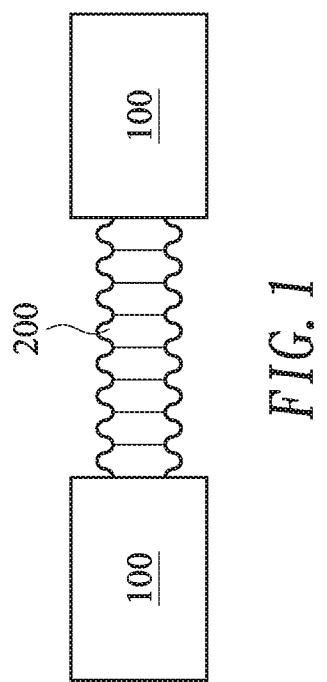
FIG. 1 schematically illustrates a basic concept of a heat dissipation device according to an embodiment of the present invention.

FIG. 1 schematically illustrates a basic concept of a heat dissipation device according to an embodiment of the present invention. As shown in FIG. 1, the heat dissipation device 1 comprises two connected components 100 and a flexible metal conduit 200. In this context, the term "flexible" indicates that the flexible metal conduit is properly bendable without breakage, and the term "metal conduit" indicates that the outer side of the flexible metal conduit is wavy in the axial direction. In the embodiment of FIG. 1, the flexible metal conduit 200 comprises plural wider segments (i.e., the segments with larger diameters) and plural narrower segments (i.e., the segments with smaller diameters). The plural wider segments and plural narrower segments are arranged alternately. Consequently, the outer side of the flexible metal conduit 200 is wavy in the axial direction.

Each of the connected components 100 is selected from a manifold, a quick connector, an evaporator, a condenser or a pump. It is noted that the connected component used in the heat dissipation device of the present invention is not restricted.

The two connected components 100 are in communication with each other through the flexible metal conduit 200. Since the flexible metal conduit 200 has the flexible property, the flexible metal conduit 200 is effective to absorb the designing tolerance. Moreover, since the flexible metal conduit 200 is made of the metallic material, the flexible metal conduit 200 is recyclable. Consequently, the drawbacks of the conventional technologies can be overcome. In accordance with the present invention, the metallic material of the flexible metal conduit is stainless steel, aluminum, zinc or any other appropriate metallic material.

The applicant found that the pipe body made of plastic material has the leaking problem. That is, the substance within the pipe body possibly leaks out from the pipe wall of the plastic pipe body. Under this circumstance, the reliability of the conventional heat dissipation device is deteriorated. Since the heat dissipation device of the present invention is equipped with the flexible metal conduit, the substance within the flexible metal conduit will not leak out from the metallic wall of the flexible metal conduit. When compared with the heat dissipation device using the plastic pipe, the present heat dissipation device using the flexible metal conduit can effectively avoid the leaking problem. Consequently, the reliability of the heat dissipation device is enhanced.

Figure 2:
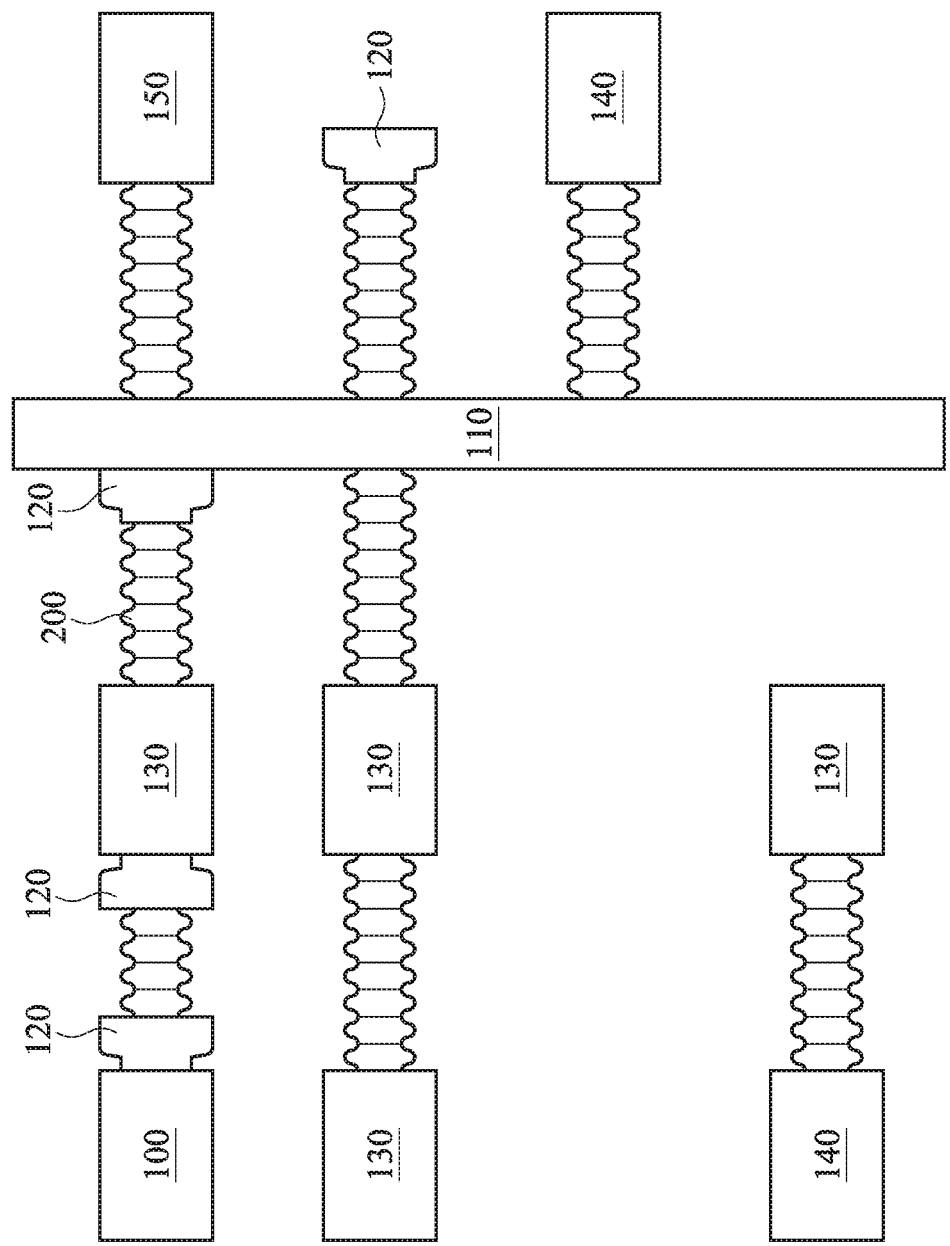
FIG. 2 schematically illustrates various examples of the heat dissipation device of the present invention.

FIG. 2 schematically illustrates various examples of the heat dissipation device of the present invention. As shown in FIG. 2, the heat dissipation device is a clustered heat dissipation device. The clustered heat dissipation device comprises a manifold 110, one or plural evaporators 130 and one or plural flexible metal conduits 200. A working medium (e.g., water) is filled in the clustered heat dissipation device. In an embodiment, the clustered heat dissipation device further comprises one or plural quick connectors 120 in order to facilitate assembling or maintaining the clustered heat dissipation device.

The clustered heat dissipation device is applied to an electronic device with plural heat sources. For example, the electronic device is a rack, a desktop host, a server, a small-sized computer, a medium-sized computer, a large-sized computer or a supercomputer. During the operation of the electronic device, many components such as CPU, GPU or memory modules within the electronic device generate heat. For maintain the normal operation of the electronic device, it is necessary to remove the heat.

In an embodiment as shown in FIG. 2, the two connected components 100 are a manifold 110 and an evaporator 130, respectively. The manifold 110 and the evaporator 130 are in communication with each other through a flexible metal conduit 200. The manifold 110 has the functions of diverting and collecting the working medium. In an embodiment, the manifold 110 receives the cooled working medium and provides the cooled working medium. In an embodiment, the manifold 110 is made of metallic material or non-metallic material with good thermal conductivity. Consequently, the manifold 110 is helpful for removing the heat from the working medium. For example, the evaporator 130 is a heat-absorbing head or a cold plate. The evaporator 130 is directly attached on the heat source (not shown), or an intermediate medium (e.g., a thermal grease, an adhesive, a soldering material or a heat conduction block) is clamped between the evaporator 130 and the heat source. After the working medium within the evaporator 130 absorbs heat, the working medium is transferred to the manifold 110 through the flexible metal conduit 200.

In an embodiment as shown in FIG. 2, the two connected components 100 are evaporators 130. The two evaporators 130 are in communication with each other through a flexible metal conduit 200. After the working medium within the evaporator 130 away from the manifold 110 absorbs heat, the working medium is transferred to the evaporator 130 close to the manifold 110 through the flexible metal conduit 200.

In an embodiment as shown in FIG. 2, the two connected components 100 are a quick connector 120 and an evaporator 130, respectively. The quick connector 120 and the evaporator 130 are in communication with each other through the flexible metal conduit 200. The quick connector 120 comprises an outer sleeve element and an inner sleeve element. The outer sleeve element and the inner sleeve element may be engaged with each other or disengaged from each other. After the working medium within the evaporator 130 absorbs heat, the working medium is transferred to the quick connector 120 through the flexible metal conduit 200 and then transferred to the manifold 110.

In an embodiment as shown in FIG. 2, the two connected components 100 are a manifold 110 and a quick connector 120, respectively. The manifold 110 and the quick connector 120 are in communication with each other through a flexible metal conduit 200. Then, the quick connector 120 may be connected with another component.

In an embodiment as shown in FIG. 2, the two connected components 100 are a manifold 110 and a condenser 140, respectively. The manifold 110 and the condenser 140 are in communication with each other through a flexible metal conduit 200. The working medium in the manifold 110 is transferred to the condenser 140 through the flexible metal conduit 200 and cooled down.

In an embodiment as shown in FIG. 2, the two connected components 100 are a manifold 110 and a pump 150, respectively. The manifold 110 and the pump 150 are in communication with each other through a flexible metal conduit 200. The working medium in the manifold 110 is transferred to the pump 150 through the flexible metal conduit 200.

In an embodiment as shown in FIG. 2, the two connected components 100 are quick connectors 120. The two quick connectors 120 are in communication with each other through a flexible metal conduit 200.

In an embodiment as shown in FIG. 2, the heat dissipation device is a heat exchanger comprising an evaporator 130, a condenser 140 and a flexible metal conduit 200. The evaporator 130 and the condenser 140 are in communication with each other through the flexible metal conduit 200.

The way of connecting the flexible metal conduit with the connected component is not restricted. For example, the flexible metal conduit is connected with the connected component through a welding means, a screwing means or a destructive pressing means. Alternatively, the flexible metal conduit is connected with the connected component through an additional anti-releasing mechanism. Some examples of the mechanism for connecting the flexible metal conduit with the connected component will be described as follows. These examples are presented herein for purpose of illustration and description only.

Figure 3:
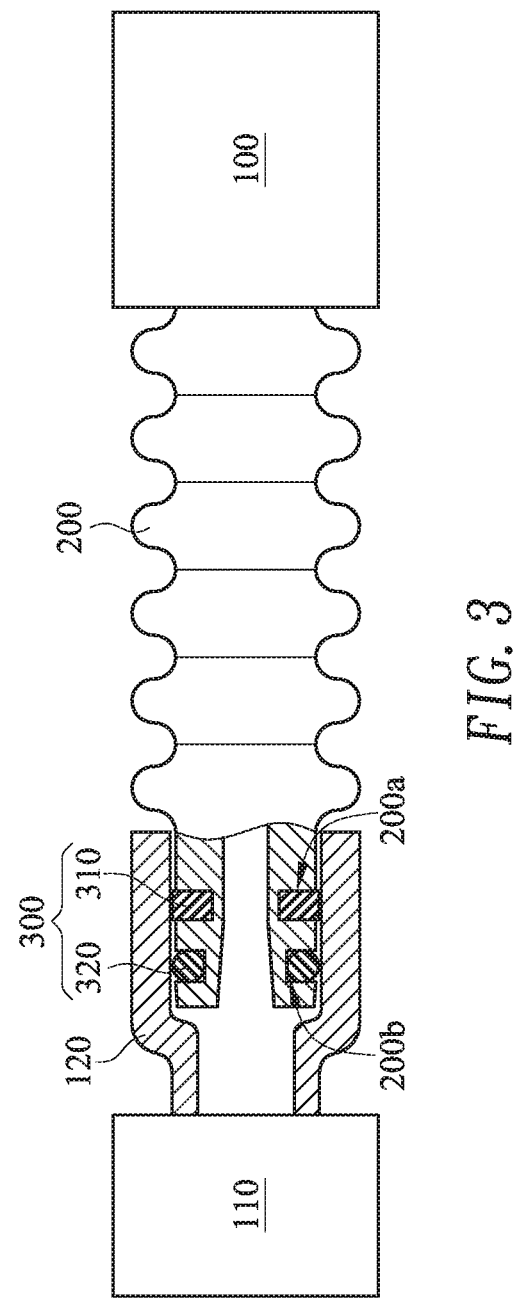
FIG. 3 schematically illustrates a portion of a heat dissipation device according to an embodiment of the present invention.

FIG. 3 schematically illustrates a portion of a heat dissipation device according to an embodiment of the present invention. As shown in FIG. 3, the heat dissipation device comprises a connected component 100, a flexible metal conduit 200, a quick connector 120 and a manifold 110. As known, the conventional plastic pipe and the connected component 100 cannot be connected with each other through a welding means. However, the flexible metal conduit 200 and the connected component 100 can be connected with each other through the welding means.

As shown in FIG. 3, the flexible metal conduit 200 is connected with the quick connector 120 through an anti-releasing mechanism 300. In an embodiment, the anti-releasing mechanism 300 comprises a retaining ring 310 and a leakproof seal ring 320. For example, the retaining ring 310 is a C-shaped retaining ring or any other appropriate retaining ring, and the leakproof seal ring 320 is a Teflon seal ring. The flexible metal conduit 200 comprises a first groove 200a and a second groove 200b. The second groove 200b is arranged beside the first groove 200a. The second groove 200b is closer to a distal end of the flexible metal conduit 200 than the first groove 200a. The retaining ring 310 of the anti-releasing mechanism 300 is accommodated within the first groove 200a. The leakproof seal ring 320 of the anti-releasing mechanism 300 is accommodated within the second groove 200b. The flexible metal conduit 200 is tightly embedded within the quick connector 120 through the retaining ring 310. The leakproof seal ring 320 can prevent from the leakage of the working medium.

In some other embodiments, the flexible metal conduit is connected with the quick connector through a screwing means or a destructive pressing means. For example, the quick connector has an internal thread, and the distal end of the flexible metal conduit has an external thread corresponding to the internal thread. Due to the engagement between the internal thread and the external thread, the flexible metal conduit is connected with the quick connector through the screwing means. Alternatively, after the distal end of the flexible metal conduit is inserted into the quick connector, the flexible metal conduit is forced to be engaged with the quick connector through the destructive pressing means. In some other embodiments, the anti-releasing mechanism further comprises pins or tenons to prevent from the detachment of the flexible metal conduit.

Figure 4:
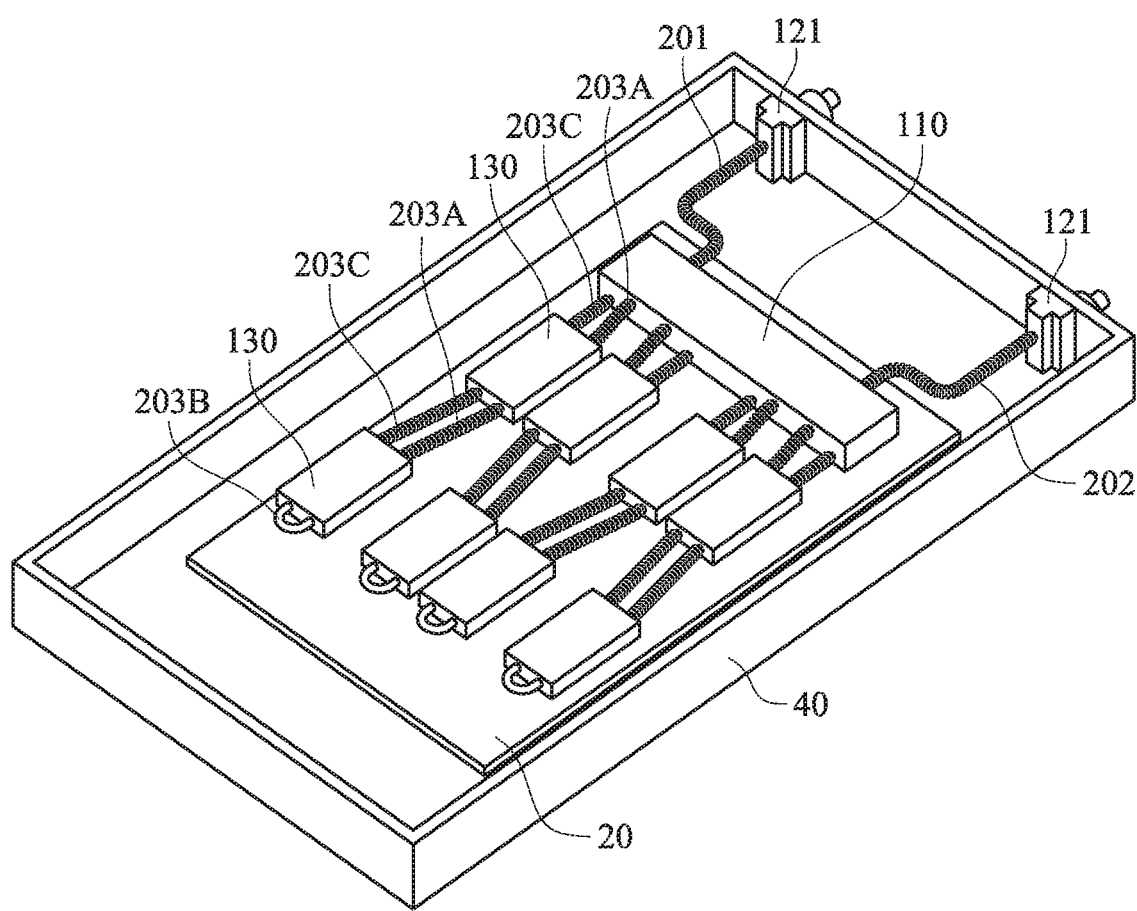
FIG. 4 is a schematic perspective view illustrating a portion of the heat dissipation device as shown in FIG. 2.

Please refer to FIG. 4 and FIG. 2. FIG. 4 is a schematic perspective view illustrating a portion of the heat dissipation device as shown in FIG. 2. In this embodiment, the clustered heat dissipation device is applied to an electronic device 20 within a host casing 40 in order to remove the heat from the electronic device 20. It is noted that the applications of the clustered heat dissipation device are not restricted.

The clustered heat dissipation device comprises at least one manifold 110, plural evaporators 130, plural conduits 201, 202, 203A, 203B, 203C, and a cooling liquid (not shown). For example, the evaporators 130 are heat-absorbing heads or cold plates. The manifold 110 comprises an inlet chamber and an outlet chamber (not shown). The manifold 110 is connected with the cooling liquid supply conduit 201. After the cooling liquid (not shown) with a lower temperature (i.e., with the decreased temperature) is received by the manifold 110 through the cooling liquid supply conduit 201, the cooling liquid is transferred to the plural evaporators 130. The manifold 110 is also connected with the cooling liquid exhaust conduit 202. After the cooling liquid is transferred through the evaporators 130, the temperature of the cooling liquid is increased. After the cooling liquid with the higher temperature (i.e., with the increased temperature) is collected to the manifold 110, the cooling liquid is transferred to an external condenser or heat exchanger (not shown) through the cooling liquid exhaust pipe 202. Consequently, the cooling liquid is cooled down. After the cooling liquid is cooled down, the cooling liquid is transferred to the manifold 110 again through the cooling liquid supply conduit 201.

Moreover, each evaporator 130 is in thermal contact with a heat source (not shown) of the electronic device 20. Consequently, when the cooling liquid is transferred through the inner portions of the evaporator 13, the temperature of the cooling liquid is increased or the cooling liquid is subjected to a phase change to carry away the heat.

The operating principles of the heat dissipation device as shown in FIG. 4 will be described as follows. After the cooling liquid is outputted from the manifold 110, the cooling liquid is transferred to the evaporator 130 through the conduit 203A. Consequently, a portion of the heat from the heat source under the corresponding evaporator 130 is absorbed by the cooling liquid. Then, the cooling liquid is transferred to a next evaporator 130. Similarly, a portion of the heat from the heat source under the evaporator 130 is absorbed by the cooling liquid. Moreover, the cooling liquid is transferred from one compartment (not shown) of the evaporator 130 to another component (not shown) of the evaporator 130 through the conduit 130. Consequently, the cooling liquid is returned to the evaporator 130 to absorb another portion of the heat from the underlying heat source. Afterwards, the cooling liquid is returned to the manifold 110 through the conduit 203C.

Generally, the space of the host casing 40 is very narrow. According to the installation positions of the electronic device 20 or other electronic components, the components of the clustered heat dissipation device perhaps need to be finely tuned along the upward/downward direction, the forward/backward direction or the leftward/rightward direction. In accordance with the feature of the present invention, the cooling liquid supply conduit 201, the cooling liquid exhaust pipe 202, the conduit 203A and the conduit 203C can be selectively replaced by the flexible metal conduits. Even if the space of the host casing 40 is narrow, the uses of the flexible metal conduits are helpful to finely adjust the components in the assembling process. Consequently, the flexibility in operation or maintenance is largely enhanced.

For example, the cooling liquid supply conduit 201 and the cooling liquid exhaust pipe 202 are flexible metal conduits and arranged between the manifold 110 and the joints 121 of the host casing 40. In case that the altitudes of the manifold 110 and the joint 121 are different, the uses of the flexible metal conduits are helpful to finely adjust the components in the assembling process. Moreover, according to the practical locations of the heat source of the electronic device 20 between the manifold 110 and the evaporator 130, the evaporator 130 is finely tuned in forward/backward direction or the leftward/rightward direction. Moreover, the conduit 203A formed of the flexible metal conduit provides a fine-tune tolerance, and the connecting firmness between the manifold 110 and evaporator 130 is not adversely affected.

Moreover, since the cooling liquid supply conduit 201, the cooling liquid exhaust pipe 202, the conduit 203A and the conduit 203C are flexible metal conduits, the risks of loosening these conduits in the future will be minimized. As mentioned above, these conduits are made of metallic material. Optionally, the connected components (e.g., the manifold 110 or the evaporator 130) are also made of metallic material. These connected components and the flexible metal conduits may be connected with each other through the welding means. Consequently, the benefits of using the flexible metal conduits to finely adjust the components in the assembling process can be achieved.

Of course, the conduits as shown in FIG. 4 may be partially or completely replaced by the flexible metal conduits according to the practical requirements.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A heat dissipation device, comprising:
   two connected components, wherein each connected component is selected from a manifold, a quick connector, an evaporator, a condenser or a pump; and
   a flexible metal conduit, wherein the two connected components are in communication with each other through the flexible metal conduit, wherein the flexible metal conduit comprises a plurality of wider segments and a plurality of narrower segments, the wider segments and the narrower segments are arranged alternately to form a wavy outer side of the flexible metal conduit in an axial direction, one of the two connected components is the quick connector, the flexible metal conduit is connected with the quick connector through an anti-releasing mechanism, the flexible metal conduit comprises a groove formed on an outer surface of one end of the flexible metal conduit, the anti-releasing mechanism comprises a leakproof seal ring accommodated within the groove formed on the outer surface of the end of the flexible metal conduit, and the end of the flexible metal conduit is inserted into the quick connector.

2. The heat dissipation device according to claim 1, wherein the two connected components are the manifold and the quick connector, respectively.

3. The heat dissipation device according to claim 1, wherein the two connected components are the quick connector and the evaporator, respectively.

4. The heat dissipation device according to claim 1, wherein the two connected components are the quick connector and the condenser, respectively.

5. The heat dissipation device according to claim 1, wherein the two connected components are the quick connector and the pump, respectively.

6. The heat dissipation device according to claim 1, wherein the anti-releasing mechanism further comprises a retaining ring, and the flexible metal conduit further comprises another groove formed on the outer surface of the end of the flexible metal conduit, wherein the retaining ring is accommodated within the another groove.

7. A heat dissipation device, comprising:
   two connected components, wherein each connected component is selected from a manifold, an evaporator, a condenser or a pump; and
   a flexible metal conduit, wherein at least one of two ends of the flexible metal conduit has a quick connector, and the two connected components are in communication with each other through the flexible metal conduit, wherein the flexible metal conduit comprises a plurality of wider segments and a plurality of narrower segments, the wider segments and the narrower segments are arranged alternately to form a wavy outer side of the flexible metal conduit in an axial direction, the flexible metal conduit is connected with the quick connector through an anti-releasing mechanism, the anti-releasing mechanism comprises a retaining ring and a leakproof seal ring, and the flexible metal conduit comprises a first groove formed on an outer surface of one end of the flexible metal conduit and a second groove beside the first groove formed on the outer surface of the end of the flexible metal conduit, wherein the retaining ring is accommodated within the first groove, the leakproof seal ring is accommodated within the second groove, and the end of the flexible metal conduit is inserted into the quick connector.

* * * * *